(12) United States Patent
Nagamatsu

(10) Patent No.: US 7,598,763 B2
(45) Date of Patent: Oct. 6, 2009

(54) PROBE CONTACTING ELECTRODE AND ELECTRONIC DEVICE

(75) Inventor: Shoichi Nagamatsu, Fujisawa (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 11/808,519

(22) Filed: Jun. 11, 2007

(65) Prior Publication Data
US 2007/0296429 A1  Dec. 27, 2007

(30) Foreign Application Priority Data
Jun. 12, 2006 (JP) .............................. 2006-161968
Apr. 10, 2007 (JP) .............................. 2007-102415

(51) Int. Cl.
*G01R 31/26* (2006.01)
*G01R 31/02* (2006.01)

(52) U.S. Cl. ...................................... 324/765; 324/754

(58) Field of Classification Search ................. 324/754, 324/763–765, 158.1; 257/661–786
See application file for complete search history.

(56) References Cited

U.S. PATENT DOCUMENTS

| 6,229,404 B1 * | 5/2001 | Hatanaka ..................... 331/68 |
| 6,563,330 B1 * | 5/2003 | Maruyama et al. ........... 324/754 |
| 6,587,008 B2 * | 7/2003 | Hatanaka et al. ............... 331/68 |
| 6,605,522 B1 * | 8/2003 | Ezawa et al. ................. 438/613 |
| 6,892,452 B2 * | 5/2005 | Fukuda et al. ................. 29/846 |
| 6,967,537 B2 * | 11/2005 | Harima et al. ................. 331/68 |
| 7,135,810 B2 * | 11/2006 | Okajima ..................... 310/348 |
| 7,348,263 B2 * | 3/2008 | Hashimoto ................... 438/460 |
| 2004/0135645 A1 * | 7/2004 | Koyama et al. ............. 331/158 |
| 2004/0232480 A1 * | 11/2004 | Ohta et al. ................... 257/328 |
| 2006/0022319 A1 * | 2/2006 | Matsuzawa et al. ......... 257/678 |

FOREIGN PATENT DOCUMENTS

| JP | A 2000-278047 | 10/2000 |
| JP | B2 3406845 | 3/2003 |
| JP | B2 3451018 | 7/2003 |
| JP | A 2004-320420 | 11/2004 |

* cited by examiner

*Primary Examiner*—Ha Tran T Nguyen
*Assistant Examiner*—Joshua Benitez
(74) *Attorney, Agent, or Firm*—Oliff & Berridge, PLC

(57) ABSTRACT

A probe contacting electrode that is formed on a surface of a package of an electronic device and to which a probe of a probe device is contacted, including a lower layer part and an upper layer part made of a softer conductive material than a conductive material that forms the lower layer part.

11 Claims, 4 Drawing Sheets

A-A' SECTION

A-A' SECTION

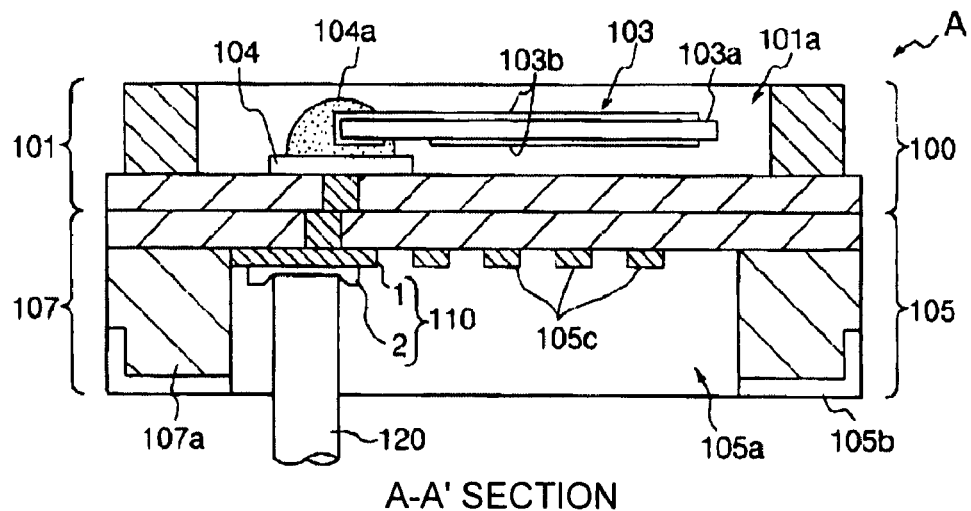
FIG.2 A-A' SECTION
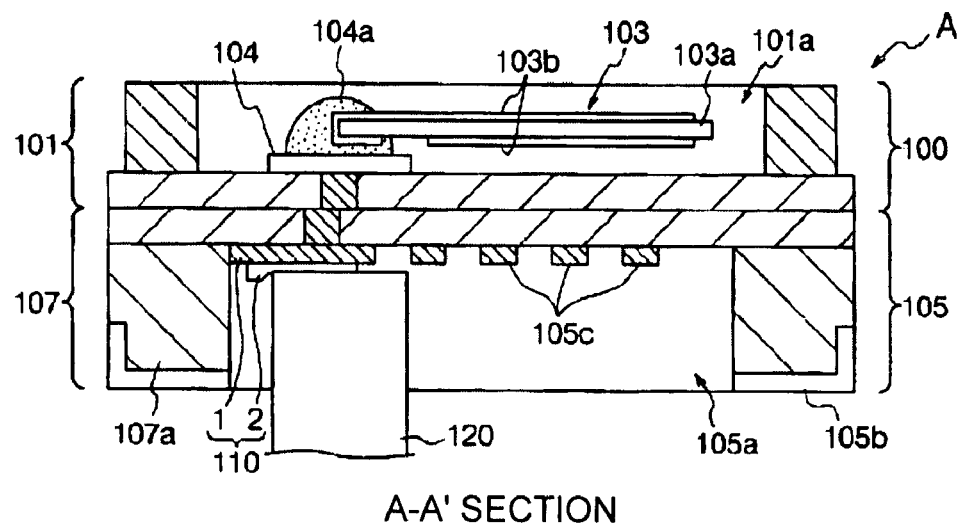
FIG.3 A-A' SECTION
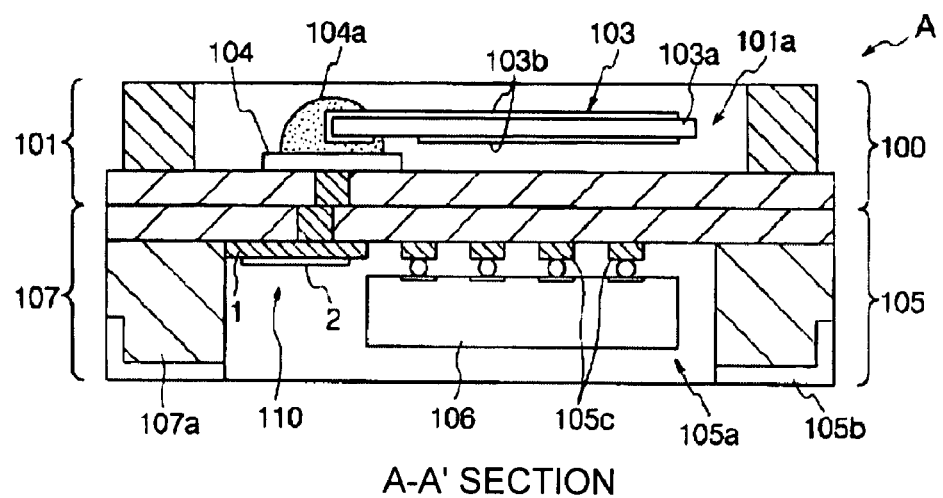
FIG.4 A-A' SECTION

A-A' SECTION

PROBE CONTACTING ELECTRODE AND ELECTRONIC DEVICE

BACKGROUND OF THE INVENTION

1. Technical Field

The present invention relates to an electrode to which a probe contacts, with which it is possible to avoid inconveniences associated with operations using a probe device such as characteristics measurements of electronic devices and data-input into IC parts. The invention also relates to an electronic device thereof.

2. Related Art

In a field of a mobile communication terminal device, many manufactures promote module packaging of components by function in consideration of factors including utility in implementation of electric components, repair and maintenance, handleability, components compatibility among devices and the like. With increasing demands for this module packaging, downsizing and cost cutting of components are strongly requested.

Particularly, circuit components of a reference oscillator, a phase-locked loop (PLL) circuit, a synthesizer circuit and the like are often packed in modules because functions and mechanical structures of these circuits are well established, and high stability and performance in operation are requested for these circuits. Moreover, when components of such circuit are packaged in a module, there is an advantage that a shield structure can be easily built.

An example of the electronic component that is mounted on a surface and made up of related parts which can be packaged and made into modules are a piezoelectric resonator, a piezoelectric oscillator, a surface acoustic wave (SAW) device and the like. In order to further minimize the size of the electric component as well as to keep the high performance, for example, a module having a two-story structure shown in FIG. 6 has been proposed.

JP-A-2000-278047 is a first example of related art, and Japanese Patent No. 3,406,845 is a second example of the related art. Japanese Patent No. 3,451,018 is a third example and JP-A-2004-320420 is a fourth example of the related art.

FIG. 6A is a plan view of a hitherto known piezoelectric device (quartz crystal oscillator) which will be mounted on a surface in the form of the two-story structure module (H-type). FIG. 6B is a schematic longitudinal view of the piezoelectric device and FIG. 6C is a bottom view of the piezoelectric device. A quartz crystal oscillator A includes a case (package) 101 made of ceramic, a metal lid 102, a quartz crystal resonator 100, a case (package) 105 and a bottom structure (IC part unit) 107. The quartz crystal resonator 100 includes a quartz crystal resonator element (piezoelectric element) 103 which is coupled to an element mounting pad 104 through conductive adhesive 104a. The element-mounting pad 104 is provided in a space (an upper-side concave portion) 101a between the case 101 and a metal lid 102. The quartz crystal resonator element 103 includes an exiting electrode 103b which is provided respectively on the both sides of a crystal substrate 103a. An IC part mounting electrode 105c is provided on the ceiling plane of a space (a lower-side concave portion) 105a situated in the case (package) 105 that is coupled to the bottom face of the quartz crystal resonator 100. An IC part 106 including an oscillation circuit, a temperature compensated circuit and the like is barely implemented on the IC part mounting electrode 105c in the bottom structure (IC part unit) 107. A mounted terminal 105b provided on the bottom of the case 105 is used to solder the quartz crystal oscillator A in order to implement the oscillator onto a print substrate (see the first example).

The quartz crystal oscillator A has two monitor electrodes (probe contacting electrodes) 110 for adjusting (measuring) a frequency of the quartz crystal resonator element 103 and for simultaneously checking the characteristics of the quartz crystal resonator element 103. Referring to FIG. 6B and FIG. 6C, the monitor electrodes 110 are provided on the ceiling plane of the space 105a and on one side of the longitudinal direction of the ceiling plane. The monitor electrodes 110 will be covered by the IC part when the IC part is mounted (see the first and second examples). An adjustment operation is performed by making two probe pins (contacting members) 120 contact with the monitor electrodes 110 before the IC part is mounted. The crystal oscillating element is excited and oscillates when the probe pins conductively contact with the monitor electrode 110, and the frequency of the oscillation can be measured in this way. Where the obtained figure of the frequency dose not lie in the targeted frequency range, the frequency can be adjusted by for example increasing the film thickness of the exiting electrode on the crystal oscillator element.

The quartz crystal oscillator A can be assembled in the following way. After the quartz crystal resonator element 103 is firstly mounted in the case 101, the probe pins 120 are then made contact with the two monitor electrodes 110 that are placed in the space 105a of the case 105 so as to check the characteristics of the quartz crystal resonator element 103 and to perform the adjustment of the quartz crystal resonator element 103. After the adjustment is made, the upper-side concave portion 101a is sealed with the metal lid 102. The IC part 106 is subsequently flip-chip mounted on the IC part mounting electrode 105c in the space 105a.

Meanwhile, before the terminals of the IC part 106 are coupled onto corresponding IC part mounting electrodes 105c in the flip-chip way with a conductive bump, it is necessary to harden the IC part mounting electrode 105c by applying pressure. By hardening the IC part mounting electrode 105c, the terminal of the IC part 106 can be appropriately coupled to the mounting electrode 105c because the ultrasonic vibration energy given to the conductive bump can be transferred to the IC part mounting electrode 105c without loss. In this example, the IC part mounting electrode 105c and the monitor electrode 110 are simultaneously formed and made of the same material so that the monitor electrode 110 is also made hard. More specifically, where the IC part mounting electrode 105c and the monitor electrode 110 are formed on the ceiling plane of the space 105a which is made of ceramic, tungsten in paste form is printed on the ceramic (green-sheet) face, the printed tungsten is then pressed and hardened by a pressing means. The hardened tungsten and the ceramic are calcined at the same time and then planarized.

On the other hand, the end part of the probe pin 120 which contacts with the monitor electrode is made of a relatively hard metal material such as beryllium copper of which surface is gold-plated. When such probe pin repeatedly contacts with the hard monitor electrode, not only the gold-plated layer but also the beryllium copper part wears out. This wearing changes the contact resistance between the probe end and the monitor electrode, and the conductivity between them is deteriorated. In this case, the property of the quartz crystal resonator element cannot be properly measured. Therefore, the probe pin has to be frequently replaced with a new one and this decreases the production efficiency.

In addition to the monitor electrode, the same problem can occur to an electrode which is formed outer face of the package of the surface-mount type piezoelectric oscillator and through which data is inputted into the IC part by contacting the probe. Moreover, a mounted terminal is formed at the bottom of the package in order to monitor the frequency of a packaged surface-mounting type quartz crystal resonator. The same problem of wearing out can occur to the mounted terminal if the probe repeatedly contacts with the terminal. Furthermore, the same problem can also happen at a monitor electrode formed on the outer face of the package so as to monitor the characteristics of a SAW resonator.

The same problem can occur to any electrodes provided in any surface-mounting type electronic devices for measuring characteristics or for data input and to which a probe contacts in addition to the piezoelectric device.

In the hitherto known surface-mounting type electronic devices, where the electrode (the probe contacting electrode) used for measuring characteristics of the element included in the package or for writing data into the IC part is hardened or made solid, the metal material of the probe end where contacts with the electrode wears out in a short time period and the conductivity between the probe and the electrode deteriorates. For this reason, the probe has to be frequently replaced by a new one.

SUMMARY

An advantage of the present invention is to provide a probe-contacting electrode and an electronic device thereof, where the above-mentioned problem is solved and productivity can be improved by using the probe for longer time period. Namely, in the problem, a probe loses its durability in a shot time period since a probe contacting electrode contacting the probe is hardened.

According to a first aspect of the invention, a probe contacting electrode is formed on a surface of a package of an electronic device and is contacted with a probe of a probe device. The probe includes a lower layer part and an upper layer part made of a softer conductive material than a conductive material that forms the lower layer part.

The probe contacting electrode here is an electrode to which a contact member (for example a probe including a probe pin and the like) is contacted. Such probe contacting electrode encompasses a monitor electrode that is provided in a measuring object (an electronic device), an electrode used for inputting data and the like. The upper part of the electrode is made of a conductive material such as metal. The upper part is made softer than the lower part.

The hitherto known probe contacting electrode is formed in the same time process as other electrodes are formed and made hard in the same way as the other electrodes. Accordingly, when a probe that is made of a softer metal is contacted with the contacting electrode, the probe is eroded little by little and the probe had to be replaced with a new one for a short time period. In order to solve such problem, the upper layer part where the probe directly contacts is made softer than the lower layer part according to the first aspect of the invention. In this way, it is possible to enhance the durability of the probe relatively and the probe can be used for a longer time period compared with the hitherto known probe.

In this case, a thickness of the upper layer part may be smaller than the thickness of the lower layer part. The height of the probe contacting electrode is made lower by making the upper layer part of the probe contacting electrode thin. Thereby it is possible to prevent the IC part from contacting with the probe contacting electrode even if the IC part is mounted at a slightly displaced position when the IC part is mounted on an IC part mounting electrode through a bump or the like.

Alternatively, a thickness of the upper layer part may be larger than the thickness of the lower layer part. The height of the probe contacting electrode can be made higher than other electrodes by making the upper layer part of the probe contacting electrode thicker. In this way, it is possible to prevent the probe from contacting the other electrodes and the like even if the diameter of the probe is a soft conductive material thick. Consequently, the probe can be used for a long time period.

The lower layer part may be a lower metal layer formed on the surface of the package, and the upper layer part may be an upper metal layer that is made of a soft metal and formed on the lower metal layer. The upper metal layer and the lower metal layer can be made from the same material but with a different hardness, or these layers can be made from different materials. The upper metal layer to which the probe directly contacts is made softer than the lower metal layer so that it is possible to prevent the probe from being deteriorated and the probe can be used for a long time period.

In this case, the lower metal layer may be a metal layer that is hardened by applying pressure, and the upper metal layer may be a metal layer that is unpressed. The metal layer which is hardened by applying pressure is the lower metal layer and the metal layer which is not pressed and made soft is the upper metal layer however the lower metal layer and the upper metal layer are made of the same metal material. The upper metal layer softer than the lower metal layer can be formed easily by pressing the lower metal to harden and unpressing the upper metal layer.

The package may be made of ceramic. The lower metal layer may be a pressed metal layer that is formed by providing a paste-form metal layer on the package and hardening the paste-form metal layer by applying pressure on the layer. The upper metal layer may be an unpressed metal layer that is formed by providing a paste-form metal on the lower metal layer, and these metal layers may be solidified by baking together with the package. In this way, the metal layers can be formed simultaneously with the package through the same baking process. Therefore, it is possible to simplify the manufacturing process of the metal layers.

In this case, the material that forms the metal layers may be tungsten or molybdenum. If the metal material forming the metal layers is tungsten or molybdenum, the metal layers can be baked together with the package made of ceramic.

It is preferable that the upper layer part be made of a conductive material that is softer than a material that forms the probe. The upper layer part to which the probe directly contacts is made softer than the probe so that it is possible to use the probe for a long time period.

According to the embodiments of the invention, the electronic device is the surface-mounting type quartz crystal oscillator An electronic device according to a second aspect of the invention includes the above-described probe contacting electrode. The above-described probe contacting electrode according to the first aspect of the invention can be applied to all sorts of electronic devices. According to the second aspect of the invention, the electronic device has the probe contacting electrode so that it is possible to prevent a probe which is used for measuring characteristics of the electronic device from being deteriorated and the probe can be used for a long time period.

In this case, the electronic device may be a surface-mounting type piezoelectric device, and the probe contacting electrode may be an electrode (a mounting terminal or an electrode exclusively formed) for measuring a frequency of a piezoelectric element that is provided on the face of the ceramic package.

As for the piezoelectric device, there are a piezoelectric resonator, a piezoelectric oscillator, a SAW resonator and the like. The probe contacting electrode mounted on such piezoelectric device includes an electrode through which characteristics of the mounted piezoelectric element (such as a piezoelectric resonator element and a SAW resonator element) is measured and an electrode through which data is inputted through an IC part mounted on an oscillator. A probe is used to measure a frequency of the piezoelectric element. In the above-mentioned way, it is possible to prevent the probe from being deteriorated and the probe can be used for a long time period.

The electronic device may be a surface-mounting type piezoelectric oscillator that has an IC part, and the probe contacting electrode may be an electrode for inputting data into the IC part that is provided on the face of the ceramic package. In this way, it is possible to prevent a probe which is used for inputting data into the IC part from being deteriorated and the probe can be used for a long time period.

BRIEF DESCRIPTION OF THE DRAWINGS

The invention will be described with reference to the accompanying drawings, wherein like numbers reference like elements.

FIG. 2 shows a small probe whose end part area is smaller than an area of a monitor electrode surface and which is contacting with the monitor electrode.

FIG. 3 shows a large probe whose end part area is larger than the area of the monitor electrode surface and which is contacting with the monitor electrode FIG. 4 is a longitudinal sectional view of a piezoelectric oscillator according to an embodiment.

DESCRIPTION OF EXEMPLARY EMBODIMENTS

Figure 1A:
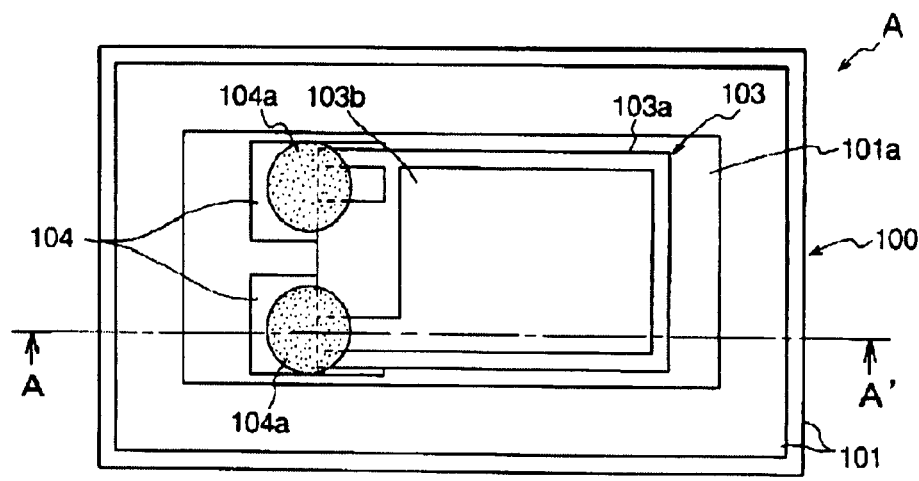
FIG. 1A is a plane view schematically showing a structure of a surface-mounting type quartz crystal oscillator (a piezoelectric oscillator) which is an example of an electronic device having a probe contacting electrode according to an embodiment of the invention.
Figure 1B:
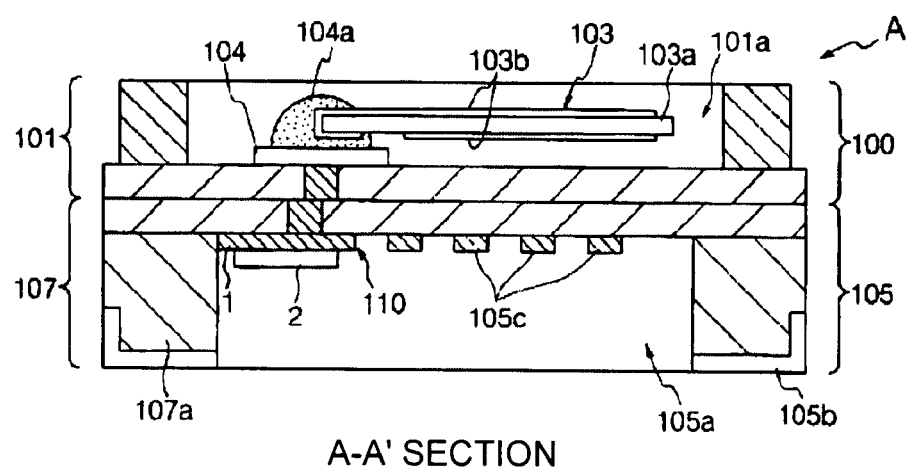
FIG. 1B is a longitudinal view of the surface-mounting type quartz crystal oscillator and FIG. 1C is a bottom view of the oscillator.
Figure 1C:
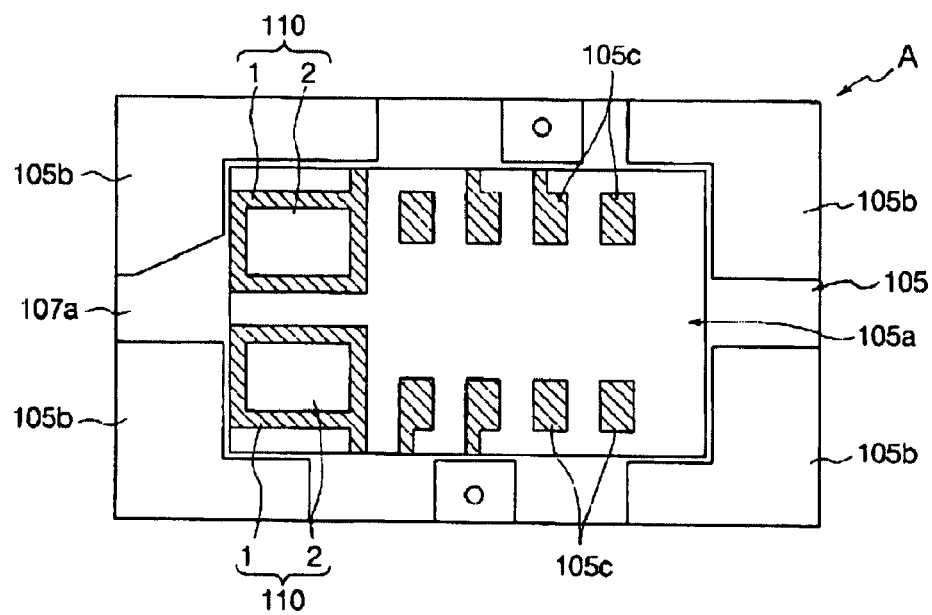

Embodiments of the invention will be described. FIG. 1A is a plane view schematically showing a structure of a surface-mounting type quartz crystal oscillator (piezoelectric oscillator) which is an example of an electronic device having a probe contacting electrode according to an embodiment of the invention. FIG. 1B is a longitudinal view of the surface-mounting type quartz crystal oscillator and FIG. 1C is a bottom view of the oscillator.

Figure 6A:
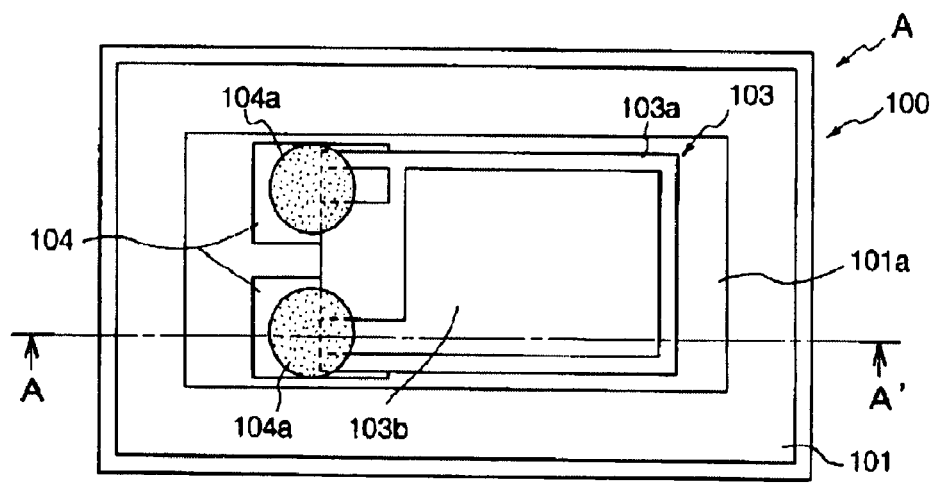
FIG. 6A is a plan view of a hitherto known piezoelectric device (quartz crystal oscillator) which will be mounted on a surface in a form of a two-story structure module (H-type)
Figure 6B:
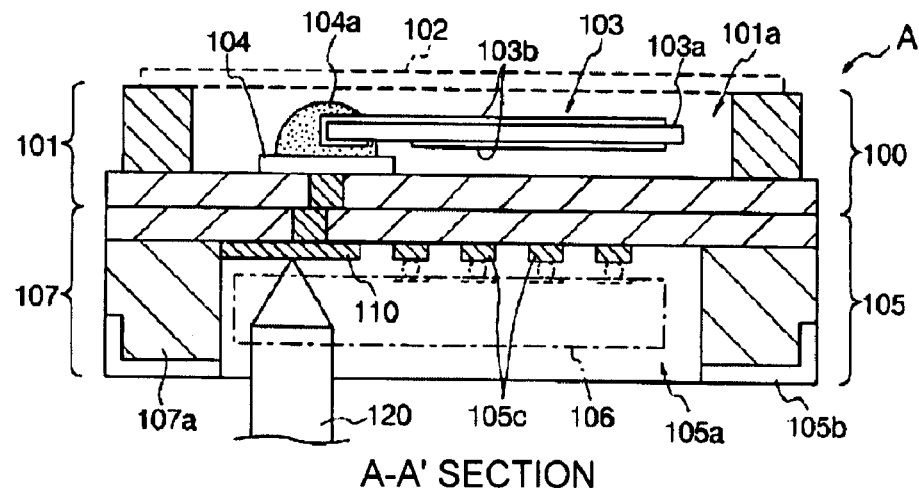
FIG. 6B is a schematic longitudinal view of the piezoelectric device and FIG. 6C is a bottom view of the piezoelectric device.
Figure 6C:
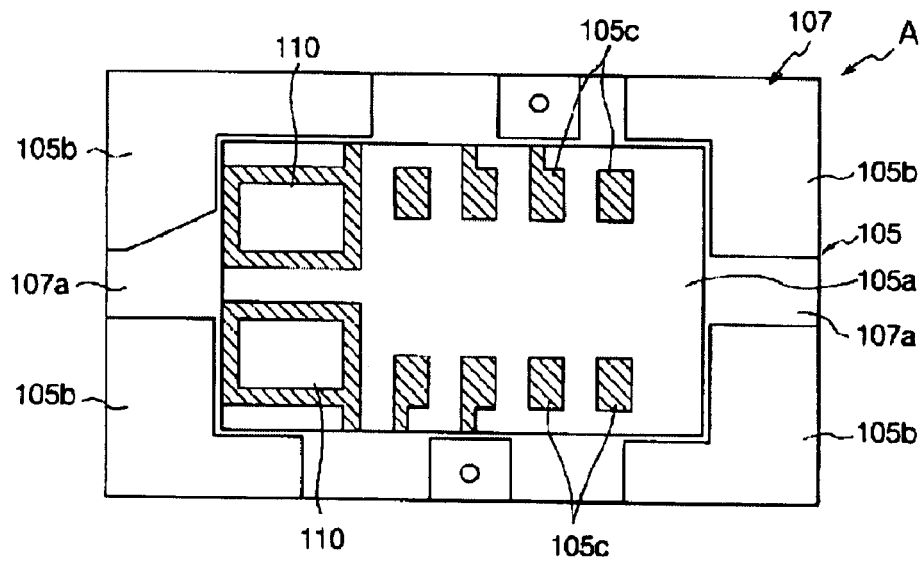

The identical numerals are given to the same components of the surface-mounting type quartz crystal oscillator as those described above with reference to FIG. 6. The surface-mounting type quartz crystal oscillator here is the measuring object.

One of the features of the monitor electrode 110 in other words the probe contacting electrode according to the embodiment is that at least an upper part of the electrode is made of a soft conductive material.

More specifically, the monitor electrode (the probe contacting electrode) 110 include a lower metal layer 1 and an upper metal layer 2. The lower metal layer 1 is formed on the ceiling plane of the space (the lower-side concave portion) 105a of the case (package) 105 that is coupled to the bottom face of the quartz crystal resonator 100. The upper metal layer 2 is formed on the lower metal layer 1 and made of a softer metal than a metal which forms the lower metal layer 1. The lower metal layer 1 is a metal layer which is hardened by applying pressure on the film. The upper metal layer 2 is a metal layer which is not compressed. In a case where the package 105 is made of ceramic, the lower metal layer 1 is then made of for example a hardened tungsten film or a hardened molybdenum film, and the upper metal layer 2 is made of for example an unhardened tungsten film or an unhardened molybdenum film which is formed on the lower metal layer. Moreover, a nickel film and a gold film are sequentially laminated on a surface of the upper metal layer and on exposed faces of the lower metal layer.

In a case where the package 105 is made of a low-temperature ceramic, the lower metal layer 1 and the upper metal layer 2 can be made of platinum, an alloy of silver, palladium or copper besides the above-mentioned tungsten and molybdenum. If the lower metal layer 1 and the upper metal layer 2 are formed on a print substrate made of glass, epoxy resin or the like, the metal layer can be made of copper. In this case, a nickel film and a gold film are also laminated on the surface of the upper metal layer and on the exposed face of the lower metal layer.

The material which forms the lower metal layer 1 may be formed of a different material from the material which forms the upper metal layer 2. The upper layer part is not necessarily made of metal but can be made of any soft conductive material.

The cases (packages) 101, 105 are manufactured in a way of batch processing by large laminating ceramic sheets (green sheets) and baking them so as to harden. The case and the metal parts can be simultaneously hardened if the baking is performed after paste-form metal films of for example tungsten for forming wiring patterns and the meal layers 1, 2 are provided among ceramic sheets and on the surface of the ceramic sheet.

The lower metal layer 1 is a pressed metal layer which is formed by printing a tungsten film in a paste form (the paste-form metal film) on the ceiling plane of the case 105 and hardening it by applying pressure with a pressing means (a pressing machine). As described above, the lower metal layer 1 is simultaneously formed with the IC part mounting electrode (the lower-side inner pad) 105c which is placed on the ceiling plane of the space 105a but other than the place where the lower metal layer 1 is formed. The upper metal layer 2 is also a tungsten film provided in a paste form (an unpressed metal layer) on the lower metal layer 1 but the film is not pressed, which is the feature different from the lower metal layer 1.

The metal layers 1, 2 are hardened by the baking process in which the cases (packages) 101, 105 are also baked. After the metal films which are provided among the laminated ceramic sheets and on the surface of the ceramic sheets have been hardened by the baking, the hardness of the lower metal layer 1 which is the pressed metal layer becomes higher than that of the upper metal layer 2 which is the unpressed metal layer. In other words, the upper metal layer 2 is softer than the lower metal layer 1 and the upper metal layer 2 is made softer than the material which forms the end part of the probe which contacts with the upper metal layer 2. The probe can be made of for example a rhodium-plated beryllium copper, a rhodium-plated hard phosphor bronze, a rhodium-plated SK-4, a gold-plated copper alloy or the like.

The surface area of the upper metal layer 2 is set substantially as large as the surface area of the lower metal layer 1 or slightly smaller than the surface area of the lower metal layer 1. In a case where the surface area of the upper metal layer 2 is set smaller than the surface area of the lower metal layer 1 and if the area of the lower metal layer surface where protrudes out from the peripheral (outline) of the upper metal layer is too large, the end part of the probe which should contact with the surface of the upper metal layer could undesirably touch the surface of the lower hard metal layer. Therefore, the sizes and the positional relation between these metal layers should be appropriately set so as to avoid the above-mentioned trouble.

The upper metal layer 2 can be formed of a conductive resin or a paste-form metal as described above.

FIG. 2 shows a small probe (probe pin) 120 whose end part has a smaller area than the area of the monitor electrode surface. The drawing shows the small probe 120 is contacting with the surface of the monitor electrode 110. The end part of the small probe 120 dose not touch the hard lower metal layer 1 but contacts only with the surface of the soft upper metal layer 2. When the probe touches the surface of the soft upper metal layer 2, the upper metal layer 2 is pressed and deformed so that the probe is in close contact with the metal layer and becomes conductive to the layer. Therefore, it is possible to prevent the probe from being damaged and worn out. The upper metal layer 2 can serve as a cushion in this way and this will protect the probe. Thereby, it is possible to enhance the durability of the probe relatively and the probe can be used for a longer time period.

FIG. 3 shows a large probe 120 whose end part area is larger than the area of the monitor electrode surface. The drawing shows that the large probe 120 is contacting with the surface of the monitor electrode. This drawing assumes that the downsizing of the probe hits the limit though the monitor electrode 110 becomes much smaller as the miniaturization of the quartz crystal oscillator advances, and consequently the diameter of the probe ends up being larger than the area of the monitor electrode. In such case, according to the embodiment, the end part of the probe contacts only with the upper metal layer 2 even if a part of the end part of the large probe 120 protrudes out from the peripheral of the monitor electrode when the probe contacts with the electrode. The upper metal layer 2 is deformed by the pressure of the probe 120 and exerts a cushioning action thereby the probe is in close contact with the metal layer so that the fine conductivity therebetween can be secured. Consequently, it is possible to measure the frequency characteristics of the quartz crystal resonator element. At the same time, it is also possible to increase the durability of the probe relatively.

Visual checking with eye is helpful to determine whether the measurement by contacting the probe with the monitor electrode is finished properly or not. The measurement will not be performed properly if the upper metal layer 2 is deformed insufficiently or slantly. In this way, it is possible to judge if the measurement is effective or not from the deformation state of the upper metal layer 2.

FIG. 4 is a longitudinal sectional view of a piezoelectric oscillator according to an embodiment of the invention. The identical numerals are given to the same components of the piezoelectric oscillator as those described above with reference to FIG. 1 and those descriptions will be omitted.

A feature of the piezoelectric oscillator in this embodiment shown in FIG. 4 is that the upper metal layer 2, which is the upper part of the monitor electrode 110 in other words the probe contacting electrode, is thinner than the lower metal layer 1 which is the lower part of the monitor electrode 110. More specifically, where the thickness of the lower metal layer 1 is about 10-25 μm, the thickness of the upper metal layer 2 is about 10±5 μm. When the layers are made in such thickness ranges, the height of the monitor electrode 110 (the thickness of the lower metal layer 1 and the upper metal layer 2 combined) can be made lower than the height of the IC part 106 which is mounted on the IC part mounting electrode 105c through the bump or the like. Thereby, it is possible to prevent the metal IC part 106 from contacting with the monitor electrode 110 even if the IC part 106 is mounted at a slightly different position when the IC part 106 is mounted on the IC part mounting electrode 105c through the bump or the like.

Though the upper metal layer 2 in the monitor electrode 110 is made thinner than the lower metal layer 1 according to the embodiment shown in FIG. 4, the upper metal layer 2 can be made thicker than the lower metal layer 1. In other words, the height of the monitor electrode 110 can be made higher than the height of the IC part mounting electrode 105c. In this case, it is possible to prevent the probe from contacting the IC part mounting electrode 105c even if the diameter of the probe is larger than the monitor electrode 110. Moreover, when the upper metal layer 2 is made of a soft conductive material and made thick, it is possible to prevent the probe form being worn out quickly so that the probe can be used for a long time period.

Though the upper metal layer 2 in the monitor electrode 110 is softer than the lower metal layer 1 in the above-described embodiment, it is preferable that the upper metal layer 2 of the monitor electrode 110 be made of a softer material than the material forming the probe. In this way, it is possible to use the probe for a much longer time period.

Figure 5A:
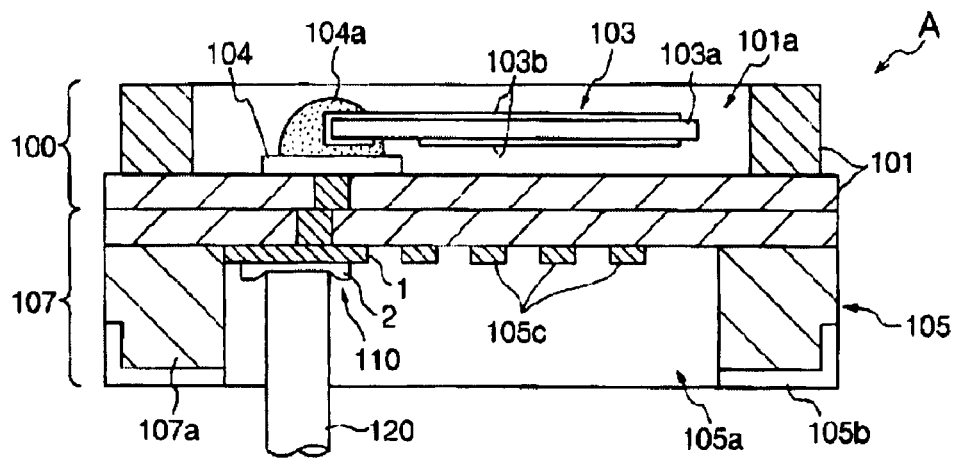
FIGS. 5A through 5C are sectional views showing a part of an assembling process of the quartz crystal oscillator which is an example of the electronic device having the probe contacting electrode.
Figure 5B:
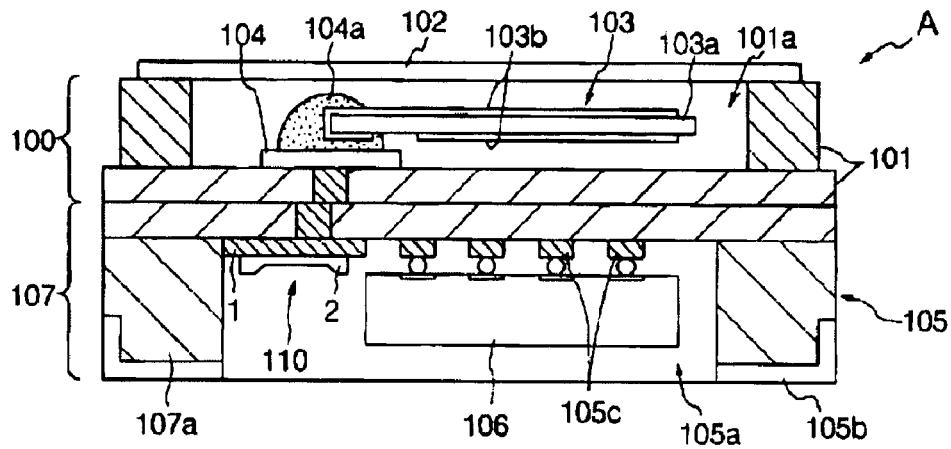
Figure 5C:
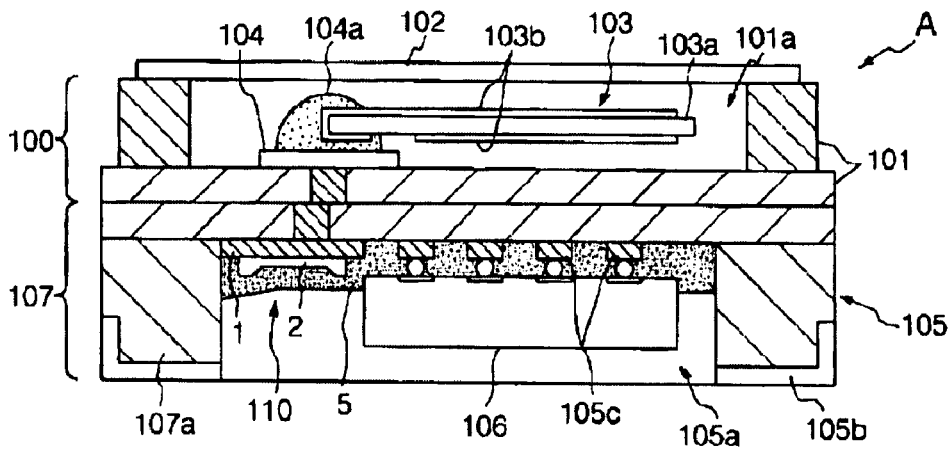

FIGS. 5A through 5C are sectional views showing a part of an assembling process (the process after the frequency measurement) of the quartz crystal oscillator which is an example of the electronic device having the monitor electrode (the probe contacting electrode) according to an embodiment of the invention.

FIG. 5A shows that the measuring is being performed by contacting the end part of the probe 120 of an unshown probe device (a measuring device) with the upper metal layer 2 which is the upper part of the monitor electrode 110. At this point, the upper metal layer 2, which is made of a metal softer than the metal which forms the end part of the probe, is concavely deformed by the pressure from the probe, and the high conductivity between the probe and the monitor electrode is secured by this close contact. Thereby, it is possible to perform an accurate measurement. Furthermore, it is possible to significantly reduce the erosion of the end part of the probe.

FIG. 5B shows the state that the upper-side concave portion 101a is enclosed with the metal lid 102 after the measurement has finished and the probe is removed from the monitor electrode in the quartz crystal oscillator. FIG. 5 also shows that the IC part 106 is coupled in a flip-chip way to the IC part mounting electrode 105c which is provided on the ceiling plane of the lower-side concave portion 105a.

FIG. 5C shows that IC part has been mounted and the lower-side concave portion 105a is filled with under-fill (resin) 5, which shows that the assembling has finished.

The probe contacting electrode described in the above-mentioned embodiments were used as the monitor electrode for the quartz crystal oscillator. However, the probe contacting electrode according to the embodiments of the invention can also be applied to a data input electrode for inputting and writing data into the IC part 106 provided on the IC part mounting electrode 105c. Such data input electrode will be provided on an appropriate place (for example a side face) of the case. When the data input electrode has the same features as those of the probe contacting electrode described in the above-embodiments, it is possible to improve the durability of the probe and the accuracy in the measurement by securing the fine conductivity.

The monitor electrode and the data input electrode according to the embodiments can be mounted as a monitor electrode for other piezoelectric devices such as a quartz crystal resonator and a SAW resonator in addition to the piezoelectric oscillator including the quartz crystal oscillator. In a case of the quartz crystal resonator, a mounting terminal (a terminal for mounting the resonator on a mother board of equipment) which is provided on the bottom face of the package and used for mounting the resonator on a surface is used as a monitor electrode (an electrode for measuring the frequency) for measuring characteristics of the quartz crystal resonator element (the piezoelectric element). This mounting terminal can be made of two layers which are the hard lower metal layer and the soft upper metal layer according to the embodiments. A probe is used when the measurement of the characteristics and the like of the quartz crystal resonator is performed. Accordingly, it is possible to prevent the probe from being worn out and the probe can be used for a longer time period.

The probe contacting electrode according to the embodiments of the invention can be further applied to any electronic devices that have an electrode for measurement of characteristics or data input into an IC part and the like besides the piezoelectric devices. A probe is used when the measurement of the characteristics or the data input into the IC part is performed. Accordingly, it is possible to prevent the probe from being worn out and the probe can be used for a longer time period.

The entire disclosure of Japanese Patent Application Nos: 2006-161968, filed Jun. 12, 2006 and 2007-102415, filed Apr. 10, 2007 are expressly incorporated by reference herein.

What is claimed is:

1. A probe contacting electrode comprising:
   a lower layer part; and
   an upper layer part made of a softer conductive material than a conductive material that forms the lower layer part;
   wherein the electrode is formed on a surface of a package of a piezoelectric device, the piezoelectric device having a frequency, and the electrode is formed such that a probe can contact the electrode to measure the frequency.

2. The probe contacting electrode according to claim 1, a thickness of the upper layer part is smaller than the thickness of the lower layer part.

3. The probe contacting electrode according to claim 1, a thickness of the upper layer part is larger than or equal to the thickness of the lower layer part.

4. The probe contacting electrode according to claim 1, wherein the lower layer part is a lower metal layer formed on the surface of the package, and the upper layer part is an upper metal layer that is made of a soft metal and formed on the lower metal layer.

5. The probe contacting electrode according to claim 4, wherein the lower metal layer is a metal layer that is hardened by applying pressure, and the upper metal layer is a metal layer that is unpressed.

6. The probe contacting electrode according to claim 4, wherein the package is made of ceramic, the lower metal layer is a pressed metal layer that is formed by providing a paste-form metal layer on the package and hardening the paste-form metal layer by applying pressure on the layer, the upper metal layer is an unpressed metal layer that is formed by providing a paste-form metal on the lower metal layer, and these metal layers are solidified by baking together with the package.

7. The probe contacting electrode according to claim 6, wherein the material that forms the metal layers is tungsten or molybdenum.

8. The probe contacting electrode according to claim 1, wherein the upper layer part is made of a conductive material that is softer than a material that forms the probe.

9. An electronic device, comprising the probe contacting electrode according to claim 1.

10. The electronic device according to claim 9, wherein the piezoelectric device is a surface-mounting type piezoelectric device, and the probe contacting electrode is provided on a face of the package and the package is ceramic.

11. The electronic device according to claim 9, wherein the piezoelectric device is a surface-mounting type piezoelectric oscillator that has an IC part, and the probe contacting electrode is an electrode for inputting data into the IC part that is provided on a face of the package and the package is ceramic.

* * * * *